(12) United States Patent
Schrittwieser et al.

(10) Patent No.: US 10,645,816 B2
(45) Date of Patent: May 5, 2020

(54) METHOD FOR CONTACTING AND REWIRING AN ELECTRONIC COMPONENT EMBEDDED INTO A PRINTED CIRCUIT BOARD

(71) Applicant: AT&S Austria Technologie & Systemtechnik Aktiengesellschaft, Leoben (AT)

(72) Inventors: Wolfgang Schrittwieser, Kapfenberg (AT); Mike Morianz, Graz (AT); Alexander Kasper, Graz (AT); Erich Preiner, St. Michael (AT); Thomas Krivec, Zeltweg (AT)

(73) Assignee: AT&S AUSTRIA TECHNOLOGIE & SYSTEMTECHNIK AKTIENGESELLSCHAFT, Leoben (AT)

( * ) Notice: Subject to any disclaimer, the term of this patent is extended or adjusted under 35 U.S.C. 154(b) by 110 days.

(21) Appl. No.: 14/902,813

(22) PCT Filed: Jun. 23, 2014

(86) PCT No.: PCT/AT2014/050137
§ 371 (c)(1),
(2) Date: Jan. 4, 2016

(87) PCT Pub. No.: WO2015/000007
PCT Pub. Date: Jan. 8, 2015

(65) Prior Publication Data
US 2016/0183383 A1 Jun. 23, 2016

(30) Foreign Application Priority Data

Jul. 4, 2013 (AT) ................ A 50439/2013

(51) Int. Cl.
*H05K 3/32* (2006.01)
*H05K 1/18* (2006.01)
(Continued)

(52) U.S. Cl.
CPC ........... *H05K 3/32* (2013.01); *H01L 23/5389* (2013.01); *H01L 24/24* (2013.01); *H01L 24/82* (2013.01);
(Continued)

(58) Field of Classification Search
CPC ...... H05K 3/32; H05K 3/4697; H05K 3/0026; H05K 3/02; H05K 1/09; H05K 1/10298;
(Continued)

(56) References Cited

U.S. PATENT DOCUMENTS 6,724,638 B1 * 4/2004 Inagaki ............... H01L 21/4857
257/E23.062
6,905,810 B2 * 6/2005 Yoshida .................. G03F 7/322
430/270.1
(Continued)

FOREIGN PATENT DOCUMENTS

CN 1321411 A 11/2001
CN 1438833 A 8/2003
(Continued)

OTHER PUBLICATIONS

International Search Report for Application No. PCT/AT2014/050137, Search completed Nov. 6, 2014, dated Nov. 21, 2014, 4 Pgs.

*Primary Examiner* — Louis J Rufo
(74) *Attorney, Agent, or Firm* — KPPB LLP

(57) ABSTRACT

A method for contacting and rewiring an electronic component embedded in a PCB in the following manner is disclosed.
A first permanent resist layer is applied to one contact side of the PCB.

(Continued)

Figure 1A:
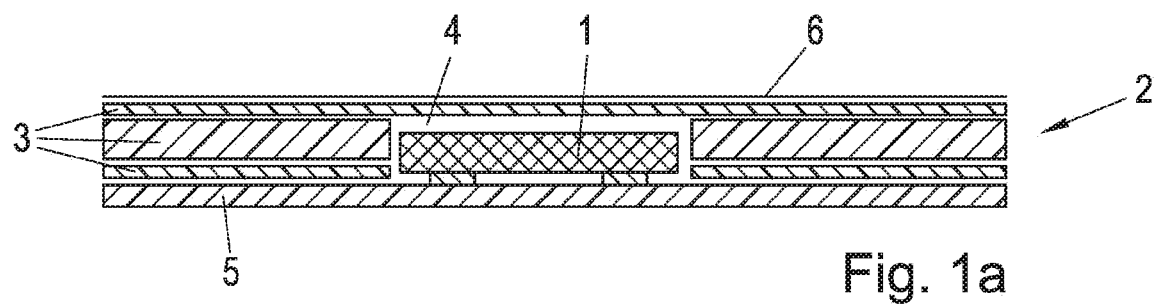
Figure 1B:
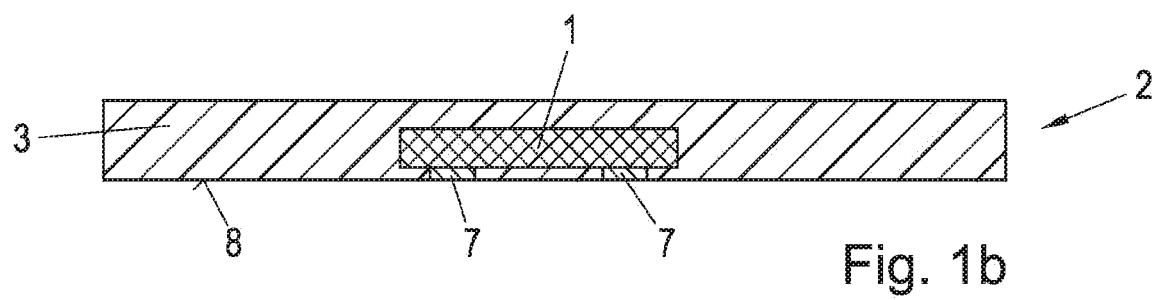
Figure 1C:
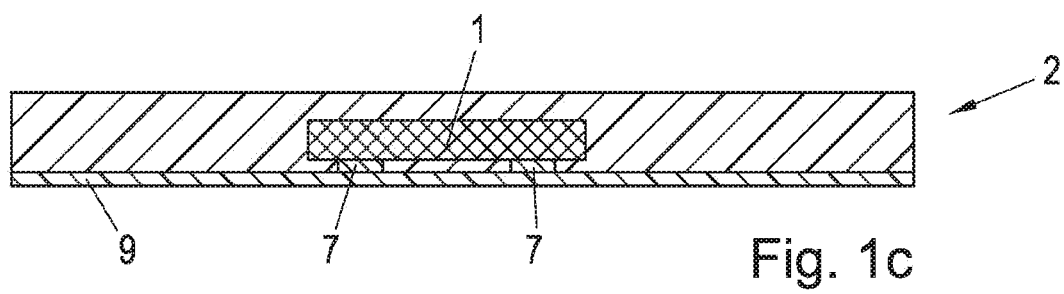
Figure 1D:
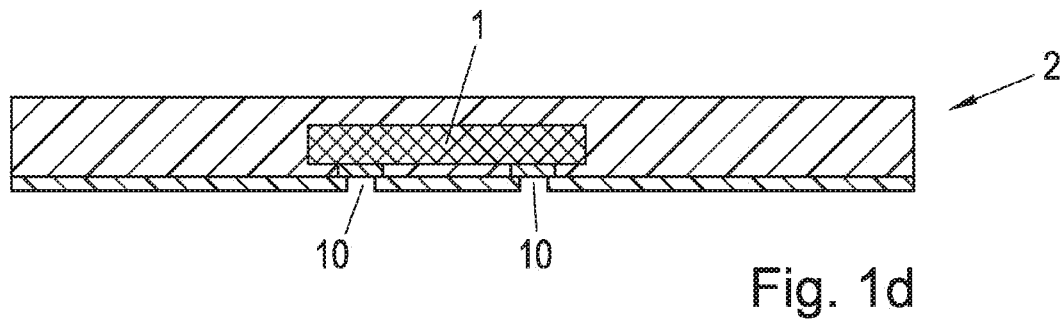
Figure 1E:
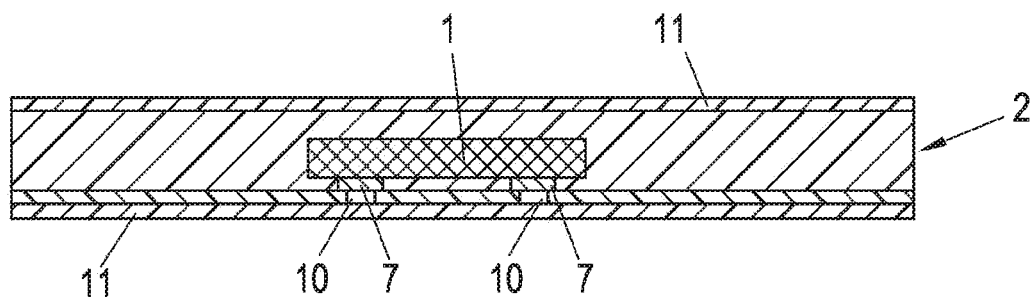
Figure 1F:
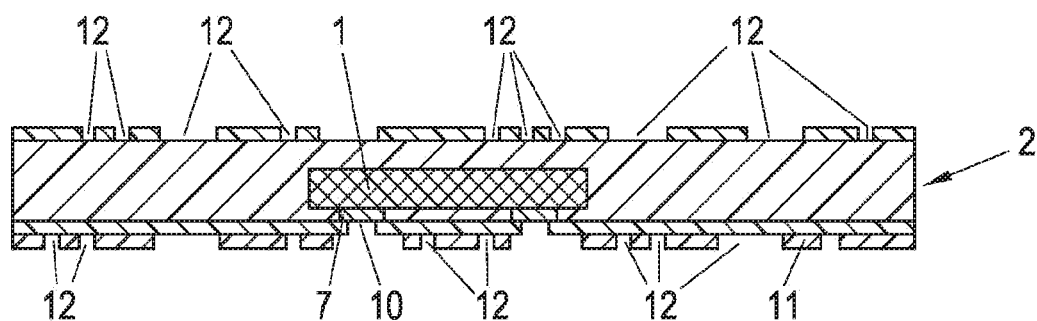
Figure 1G:
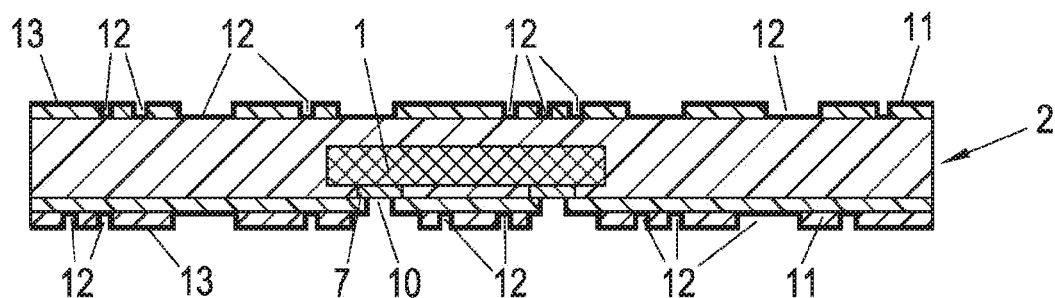
Figure 1H:
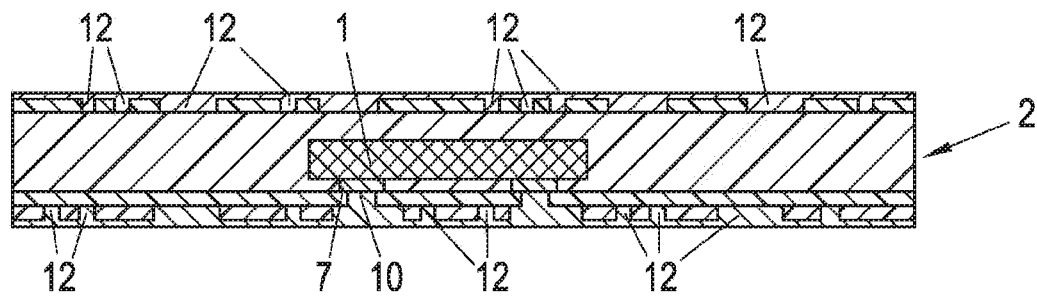
Figure 1I:
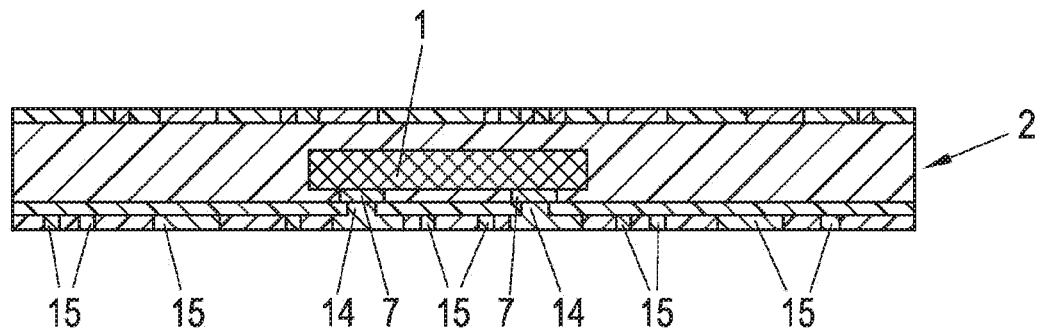

The first permanent resist layer is structured to produce exposures in the area of contacts of the electronic component.
A second permanent resist layer is applied onto the structured first permanent resist layer.
The second permanent resist layer is structured to expose the exposures in the area of the contacts and to produce exposures in line with the desired conductor tracks.
The exposures are chemically coated with copper the copper is electric-plated to the exposures.
Excess copper in the areas between the exposures is removed.

4 Claims, 2 Drawing Sheets

(51) Int. Cl.
| | |
|---|---|
| *H01L 23/00* | (2006.01) |
| *H01L 23/538* | (2006.01) |
| *H05K 1/02* | (2006.01) |
| *H05K 1/09* | (2006.01) |
| *H05K 3/46* | (2006.01) |
| *H05K 3/02* | (2006.01) |
| *H01L 21/56* | (2006.01) |
| *H05K 3/00* | (2006.01) |

(52) U.S. Cl.
CPC ............ *H05K 1/0298* (2013.01); *H05K 1/09* (2013.01); *H05K 1/185* (2013.01); *H05K 3/4697* (2013.01); *H01L 21/568* (2013.01); *H01L 2224/04105* (2013.01); *H01L 2224/8203* (2013.01); *H01L 2224/92144* (2013.01); *H05K 3/0026* (2013.01); *H05K 3/02* (2013.01); *H05K 2201/0195* (2013.01); *H05K 2201/09509* (2013.01); *H05K 2201/10674* (2013.01); *H05K 2203/0574* (2013.01); *H05K 2203/1469* (2013.01)

(58) Field of Classification Search
CPC ........... H05K 1/184; H05K 2201/0195; H05K 2201/09509; H05K 2201/10674; H05K 2203/0574; H05K 2203/1469; H01L 24/82; H01L 24/24; H01L 23/5389; H01L 2224/8203; H01L 2224/04105; H01L 21/568; C25D 5/02; C25D 5/022
See application file for complete search history.

(56) References Cited

U.S. PATENT DOCUMENTS

| | | | | |
|---|---|---|---|---|
| 7,696,442 | B2* | 4/2010 | Muramatsu | H05K 1/0231 174/260 |
| 2010/0212946 | A1 | 8/2010 | Shimizu et al. | |

FOREIGN PATENT DOCUMENTS

| | | |
|---|---|---|
| TW | 200518655 A | 6/2005 |
| WO | 2010048653 A2 | 5/2010 |
| WO | 2010048653 A3 | 5/2010 |
| WO | 2010048654 A1 | 5/2010 |
| WO | 2015000007 A1 | 1/2015 |

* cited by examiner

METHOD FOR CONTACTING AND REWIRING AN ELECTRONIC COMPONENT EMBEDDED INTO A PRINTED CIRCUIT BOARD

CROSS REFERENCE TO RELATED APPLICATIONS

This application is a national stage of Application No. PCT/AT2014/050137 filed on Jun. 23, 2014, which application claims priority to Austrian Patent Application No. A 50439/2013 filed Jul. 4, 2013, the disclosures of which are hereby incorporated by reference in their entireties.

The invention concerns a method for connecting and rewiring an electronic component embedded in a PCB as well as a corresponding PCB.

With PCBs for the assembly and electrical connection of semiconductor elements, the tendency is more and more towards miniaturization, whereby the semiconductor elements are increasingly integrated into the PCB saving space and not fixed onto the surface of them. The semiconductor elements are hereby embedded in the electrically insulating PCB material—usually a prepeg material such as FR4 material—in such a way that the entire volume of the semiconductor element is secured in the cross section of the PCB and merely the contacts or connections of the semiconductor element are exposed on the contact side of the PCB mainly planar on the surface of the PCB. This makes them accessible for the wiring of the semiconductor element through the conductor tracks formed from an electrically conducive material such as copper or aluminium on the PCB. Such PCBs with integrated semiconductor elements mostly reveal a large number of layers that are alternatingly electrically insulated and for the formation of conductor tracks that are laminated in a sequential process on top of each other so that the embedded semiconductor elements are usually covered by such layers before being connected.

According to the known methods from the best available technology, such covered contacts or connections of the semiconductor elements are exposed by way of a laser cutting method where a laser beam cuts the layers made from insulating material from the surface of the PCB covering the contacts or connections of the semiconductor element down to the metal of the contact whereby the exposed areas are filled with copper or another electrical conductor, in order to accomplish the contacting.

The laser cutting method is, however, unfavorable as the heat produced by the laser can lead to damage to the sensitive semiconductor elements where semiconductor elements and thus PCBs are becoming increasingly smaller.

The aim of this invention is thus to state a method as mentioned at the beginning by means of which highly small-scale semiconductor elements and accordingly dimensioned PCBs can be provided with precise contacting and wiring of the semiconductor elements on the PCB, whereby an excessive impact of heat on the PCB and thus related damage to the semiconductor element are to be avoided. This problem is solved by a method that is characterized by way of this invention in the following steps:

Application of a first permanent resist layer to one contact side of the PCB,

Structuring of the first permanent resist layer to produce exposures around the contacts of the electronic component Application of at least one second permanent resist layer onto the structured first permanent resist layer Structuring of the second permanent resist layer to produce exposures around the contacts and to produce exposures according to the desired conductor tracks.

Chemical coating of the exposures with copper

Electrical plating of the exposures with copper

Removal of excess copper around the exposures.

With the method according to this invention, the intention is thus to form the exposures for the contacting and wiring of the semiconductor elements in layers of permanent resist instead of with conventional insulating layers of prepeg material such as FR4, so that it is not necessary to remove the layers covering the contacts or connections of the semiconductor elements by way of laser cutting, but merely structuring the permanent resist layer by way of exposing, developing and removing or stripping the areas formed. The photoresist or permanent resist thus remains hereby in the non-structured areas on the finished PCB and consequently serves as dielectric in those areas of the PCB in which the contacting and wiring or disentangling of the PCB elements occur instead of the conventional prepeg material such as FR4 or polyimide. Due to the fact that the laser cutting method can be foregone, damage to the PCB and the semiconductor element embedded therein can be avoided.

In order to make better use of the space on the PCB for the rewiring of electronic components such as semiconductor elements, the invention is preferably further developed to the effect that the step of application of at least one second permanent resist layer in addition covers the application of a permanent resist layer on the side of the PCB opposite the contact side of the PCB. In the following structuring step of the second permanent resist layer, this permanent resist layer is also structured to form conductor tracks also on the side of the PCB opposite to the contact side of the PCB. The result of this favored method is thus a PCB with structured electrically conducive layers on both sides of the PCB, whereby the electrically conducive layers are produced by filling the exposures with permanent resist or photoresist.

Conventionally, permanent resist materials are exposed in such a way that the continuous photoresist layer is printed with a lightproof mask, then exposed and subjected to chemical treatment, by means of which and depending on the type of resist, the unexposed or the exposed area remains and the remaining areas are removed. In the case of so-called positive resists, the covered and thus unexposed areas remain whereby in the case of negative resists, the uncovered and thus exposed areas remain. The printing of the mask is thus a relatively complex step. This is the reason why in using a comparatively improved and thus favored method of this invention, it is intended that the structuring of the permanent resist layers covers the exposure of the permanent resist layers. A laser beam corresponding to the desired exposed image is guided over the continuous permanent resist layer so that the application of a photolithographic mask can be foregone.

In the following, the invention will be described in more detail in the drawing based on the example presented. In this, FIG. 1a) to 1i) display schematic sectional views of the individual steps of the method according to this invention. To avoid repetitions, the same parts of the PCB are given the same reference numbers in the drawings.

FIG. 1a) shows a semiconductor element with number 1. Semiconductor element 1 is taken within the cross-section of the PCB 2. FIG. 1a) shows the PCB prior to a lamination step and it is recognizable that the individual prepeg layers 3 form a recess that contains the semiconductor element 1. In the state in FIG. 1a), the resin of the individual layers has not yet fully spread nor hardened. As with this particular manufacturing method the semiconductor element is not glued into pre-hardened prepeg layers but the resin of the prepeg layers is poured over it, it is necessary to temporarily affix semiconductor element 1 in recess 4 with the help of adhesive band 5 prior to lamination where the prepeg hardens. An additional film is applied for lamination purposes. After lamination of this compound and removing adhesive band 5 as well as film 6, the result is the product as per FIG. 1 b), where prepeg layers 3 flow together into a practically homogenous prepeg layer 3 and harden out afterwards. Semiconductor 1 defines with its exposed contacts 7 a contact side 8 of PCB 2 on which the contacting and wiring of semiconductor 1 takes place.

As per the diagram in FIG. 1 c), now a first permanent resist layer 9 is applied to contact side 8 of PCB 2 and structured by way of exposure developing and stripping, whereby exposures 10 are formed, which make contacts 7 accessible for the contacting that follows later (FIG. 1 d)). The exposure can, as described above, be done with a laser. When developing the first permanent resist layer, the remaining photoresist is chemically changed such that after exposing the same material, there is no further development.

Subsequently, a second permanent resist layer 11 is applied (FIG. 1 e)), which does indeed at least partially close up exposures 11 formed in the step described above, but predominantly creates the possibility by way of suitable structuring of this fresh second permanent resist layer 11 to create exposures 12 in line with the desired conductor tracks (FIG. 1 f)), whereby it must be emphasized that in the event of the application step of a second permanent resist layer 11 covers the application of a permanent resist layer 11 on the side of PCB 2 opposite contact side 8 of PCB 2.

This is followed by the step of chemical treatment with copper of exposures 10 and 12, whereby a thin layer of copper 13 is applied to the permanent resist material and particularly to exposures 10 and 12 (FIG. 1 g). Now exposures 10 and 12 can be electrically plated with copper, whereby a product as displayed in FIG. 1 h) remains intact. Finally, the excess copper in the areas around exposures 10 and 12 must be removed to obtain the finished PCB 2 (FIG. 1 i). Contacting 14 of contacts 7 of the semiconductor element 1 and conductor tracks 15 were developed by the method as per this invention without having heated semiconductor element 1 excessively.

It goes without saying that the PCB gained in this way can be subjected to further processing steps without deviating from the spirit of the invention presented herein.

The invention claimed is:

1. A method for contacting and rewiring an electronic component embedded in a PCB comprising:
   applying a first permanent resist layer to a contact side of the PCB wherein the electronic component embedded in the PCB is a semiconductor element and is positioned such that contacts of the component are exposed on a contact surface of the printed circuit board and configured to be substantially planar with respect to the contact surface of the printed circuit board,
   structuring the first permanent resist layer through chemical alteration to produce exposures in an area of contacts of the electronic component,
   applying a second permanent resist layer onto the structured first permanent resist layer,
   structuring the second permanent resist layer through chemical alteration to expose a plurality of exposures in the area of the contacts and to produce the plurality of exposures in line with a plurality of desired conductor tracks, and wherein the structuring produces a stepwise transition between the first and second permanent resist layers such that an intermediate plateau step is produced between the first and second permanent resist layers and wherein the plurality of exposures in line with the plurality of desired conductor tracks have a stepwise narrowing of the exposure,
   chemical coating of the plurality of exposures with copper,
   electric-plating of the plurality of exposures with copper,
   removing excess copper in the areas between the plurality of exposures.

2. The method of claim 1 wherein applying the second permanent resist layer further comprises applying a permanent resist layer on a side of the PCB opposite the contact side.

3. The method of claim 1 wherein the structuring of the first and second permanent resist layers further comprises exposing, and developing, without cutting, the first and second permanent resist layers with a laser.

4. A PCB obtainable from the method of claim 1.

* * * * *